United States Patent [19]
Lin et al.

[11] Patent Number: 6,124,621
[45] Date of Patent: Sep. 26, 2000

[54] STRUCTURE OF A SPACER

[75] Inventors: Yung-Chang Lin, Feng-Yuan; Jih-Wen Chou, Hsin-Chu; Tung-Po Chen, Tai-Chung, all of Taiwan

[73] Assignee: United Microelectronics Corp., Hsin-Chu, Taiwan

[21] Appl. No.: 09/314,528

[22] Filed: May 19, 1999

[51] Int. Cl.[7] .............................. H01L 29/76; H01L 29/94
[52] U.S. Cl. .................... 257/412; 257/751; 257/900; 257/915
[58] Field of Search .................................... 257/344, 408, 257/900, 412, 413, 915, 751, 755

[56] References Cited

U.S. PATENT DOCUMENTS 5,324,974  6/1994  Liao ........................................ 257/344
5,334,870  8/1994  Katada et al. ........................... 257/371

*Primary Examiner*—Donald L. Monin, Jr.
*Attorney, Agent, or Firm*—Harness, Dickey & Pierce, P.L.C.

[57] ABSTRACT

A structure of a spacer in a semiconductor device is disclosed. Firstly, a gate without a spacer is provided on a substrate. A first insulating layer is formed on the sidewall of the gate. After a lightly doped drain is subsequently achieved in the substrate, a second insulating layer is formed on the first spacer. The process following this embodiment described above is to form a heavily doped drain in the substrate, then the whole MOSFET fabrication is completed. The present invention can enhance the stability of resistance of the gate and reduce pollution of the machine. Therefore, quality and efficiency of the fabrication of MOSFET will be enhanced.

13 Claims, 2 Drawing Sheets

STRUCTURE OF A SPACER

BACKGROUND OF THE INVENTION

1. Field of the Invention

The present invention relates to the semiconductor device with a spacer, and more particularly to the structure of the spacer against a gate in MOSFET.

2. Description of the Prior Art

It has been determined that hot-carrier effects will cause unacceptable performance degradation in NMOS devices built with conventional drain structures if their channel lengths are less than 2 $\mu$m. To overcome this problem, such alternative drain structures as lightly doped drains (LDDs) must used.

In the LDD structure, the drain is formed by an implant self-aligned to the gate electrode, and the other is self-aligned to the gate electrode on which two oxide sidewall spacers have been formed. The purpose of the lighter first dose is to form a lightly doped section of the drain at the edge near the channel. In NMOS devices, this dose is normally $1-2\times10^{13}$ atoms/cm$^2$ of phosphorus.

In the conventional fabrication of MOSFET, to form a gate, resist and etching are used after the metal-oxide-semiconductor (MOS) layer is formed. Unfortunately, solvent used to strip the resist will erode the sidewall of the gate to lead to a narrower width and higher electric resistance. In the following implantation for LDD, the exposing sidewall of a gate is attacked by the ions going to be implanted into the substrate. The emancipated metal particles, such as Ti, will pollute the chamber of machine. Moreover, during the stripping of photoresist used for the LDD implantation, the sidewall of the gate will be eroded, too. Therefore, the quality of products and the efficiency of fabrication will be both reduced.

For the foregoing reasons, there is a need for solving the pollution of the machine and the high electric resistance of gates to enhance both the quality of products and the efficiency of fabrication.

SUMMARY OF THE INVENTION

In accordance with the present invention, a structure of a spacer is provided to keep the gate intact after solvent and ion implantation are used. The structure of the spacer substantially could solve the problem of unstable resistance of the gate due to attack of ions in implanting process. In one embodiment, a substrate, on which there is a gate without spacer, is firstly provided. A first insulating layer, such as oxide, is formed on the substrate and the gate. Subsequently, the residual remains against the gate after the first insulating layer is etched back. A liner layer, such as oxide, is formed on the substrate and the first insulating layer to serve as the stop layer of the etching process. Next, a second insulating layer, such as nitride, is formed on the liner layer. The process following the embodiment described above is to form a heavily doped drain in the substrate by ion implantation. Then, the MOSFET is achieved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention gives a new structure of spacers of a gate. Therein, an extra thin oxide is formed before implantation to protect the gate from the attack of ions and the erosion due to solvent.

Figure 1:
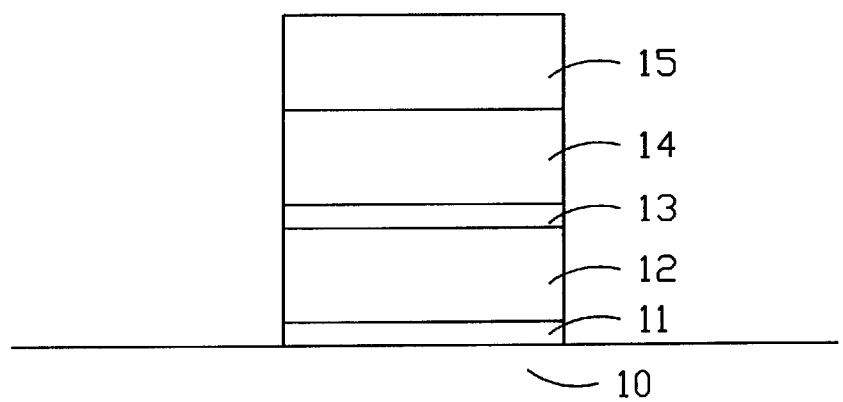
FIG. 1 shows the primary structure provided.

Referring to FIG. 1, In one embodiment of the present invention, a substrate 10 on which there is a gate without spacer is firstly provided. Therein, the gate contains a gate oxide 11 on the substrate 10, a polysilicon layer 12 on the gate oxide 11, a thin nitride layer 13 such as TiN on the polysilicon 12, a silicide layer 14 such as TiSi on the nitride 13, and an anti-reflection coating 15 on the silicide 14. The sidewall of the gate is non-insulated.

Figure 2:
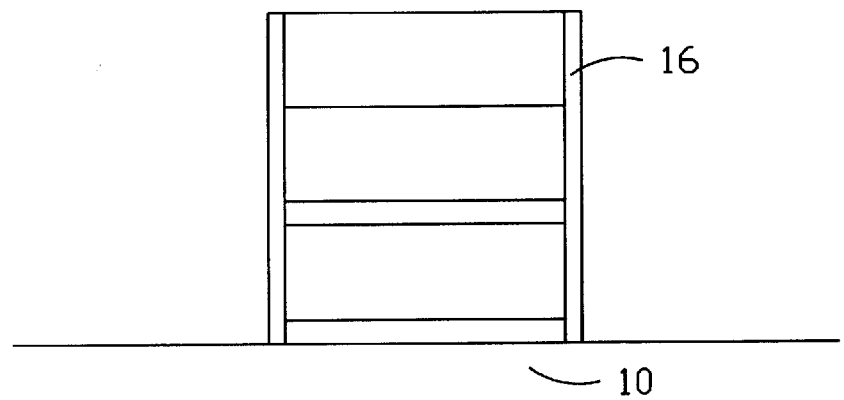
FIG. 2 shows the first spacer formed on the sidewall of the gate included in the primary structure.

Referring to FIG. 2, a thin oxide is deposited on the substrate 10 and the gate, then is etched back until the oxide resides only on the sidewall of the gate. The residual oxide 16 serves as the first insulated layer or spacer and is approximately 50–400 angstroms thick nitride may be used of the instead of the oxide.

Figure 3:
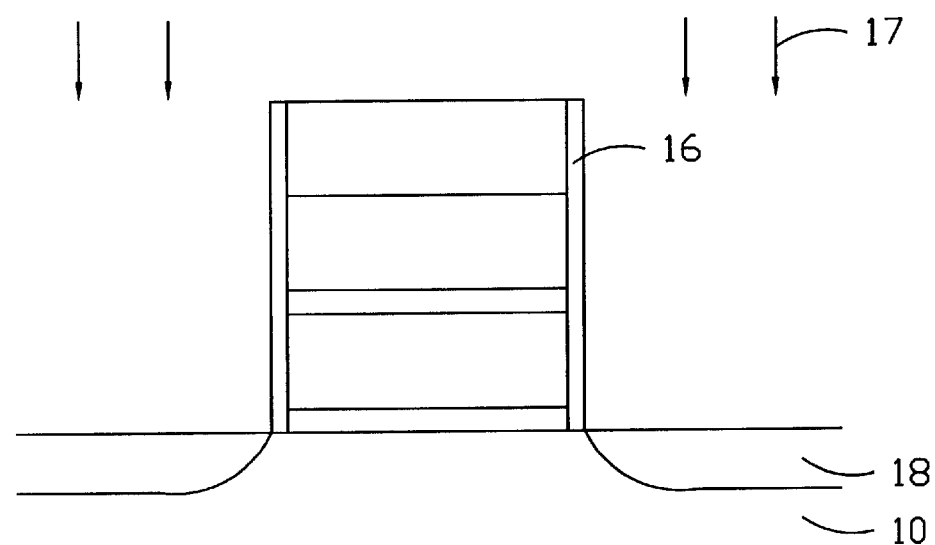
FIG. 3 shows the LDD formed in the substrate by ion implantation.

Referring to FIG. 3, ion implantation is used to form a lightly doped drain 18 in the substrate 10. For the process, ions (P$^+$ or N$^-$) 17 are implanted into the substrate 10 at a low temperature. Then, a lightly doped section of the drain at the edge near the channel is formed. During the implanting, the first spacer described above will protect the sidewall of the gate especially the TiN layer and the TiSi layer, from the attack of ions and the erosion of solvent used to strip the photoresist in implantation process.

Figure 4:
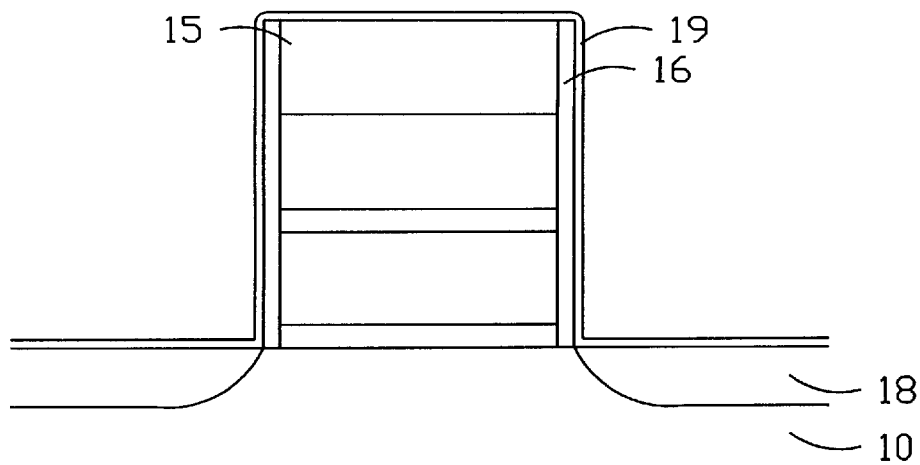
FIG. 4 shows the liner oxide formed on the first spacer.

Referring to FIG. 4, a liner oxide 19 is deposited on the LDD 18 in the substrate 10, the first spacer 16 and the top layer 15 of the gate.

Figure 5:
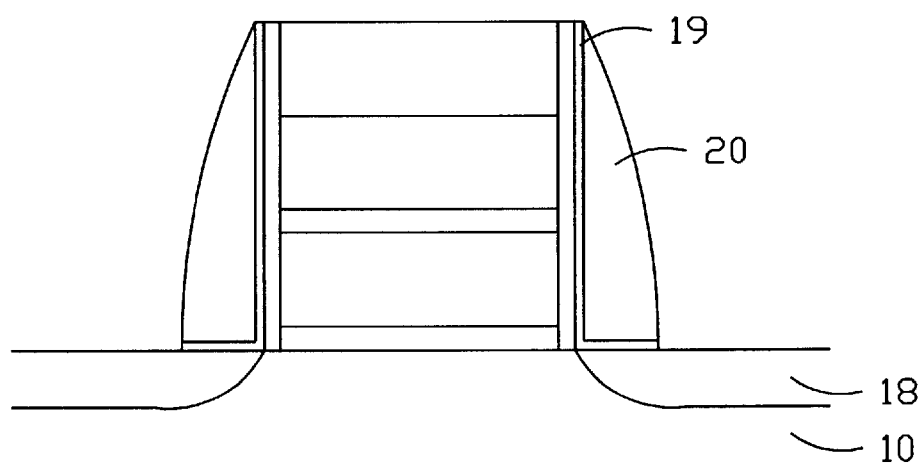
FIG. 5 shows the second spacer formed on the liner oxide.

Referring to FIG. 5, a nitride layer is deposited on the liner oxide 19 and then is etched back. The residual nitride 20 on the sidewall of the gate serves as the second insulating layer. Oxide may be used instead of the nitride in the etching back procedure, the liner oxide 19 functions as a stop layer to protect the LDD 18 in the substrate 10 from the etchant.

Figure 6:
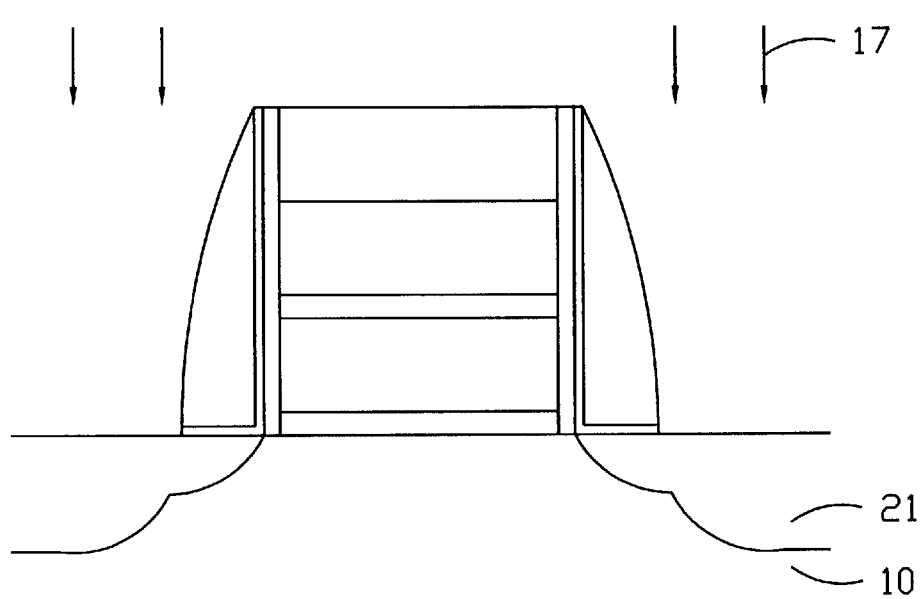
FIG. 6 shows the present invention completed.

Referring to FIG. 6, ion implantation is used again to provide a heavy doping which implants more ions 17 than before into the substrate 10. Therefore, heavily doped drain 21 containing enough P$^+$ or N$^-$ charge are achieved.

Although specific embodiments have been illustrated and described, it will be obvious to those skilled in the art that various modifications may be made without departing from what is intended to be limited solely by the appended claims.

What is claimed is:

1. Structure of a spacer against a gate which has a gate oxide, a polysilicon layer on said gate oxide, a TiN layer on said polysilicon layer and a TiSi layer on said TiN layer, comprising:

a first insulating layer formed on sidewall of said gate, said first insulating layer being used to protect sidewalls of said TiN layer and said TiSi layer from the attack of ions and the erosion of solvent used to stripping the photoresist in implantation process; and a second insulating layer formed on said first insulating layer.

2. The structure according to claim 1, wherein said first insulating layer comprises oxide.

3. The structure according to claim 1, wherein said first insulating layer comprises nitride.

4. The structure according to claim 1, wherein said first insulating layer has a thickness of the range approximately from 50 angstroms to 400 angstroms.

5. The structure according to claim 1, wherein said second insulating layer comprises oxide.

6. The structure according to claim 1, wherein said second insulating layer comprises nitride.

7. Structure of spacer against a gate which has a gate oxide, a polysilicon layer on said gate oxide, a TiN layer on said polysilicon layer and a TiSi layer on said TiN layer, comprising:

a first insulating layer formed on sidewall of said gate, said first insulating layer being used to protect sidewalls of said TiN layer and said TiSi layer from the attack of ions and the erosion of solvent used to stripping the photoresist in implantation process;

a liner layer formed on said first insulating layer; and a second insulating layer formed on said liner layer.

8. The structure according to claim 6, wherein said first insulating layer comprises oxide.

9. The structure according to claim 6, wherein said first insulating layer comprises nitride.

10. The structure according to claim 6, wherein said first insulating layer has a thickness of the range approximately from 50 angstroms to 400 angstroms.

11. The structure according to claim 6, wherein said liner layer comprises oxide.

12. The structure according to claim 6, wherein said second insulating layer comprises oxide.

13. The structure according to claim 6, wherein said second insulating layer comprises nitride.

* * * * *